United States Patent
Minoura et al.

(10) Patent No.: US 8,586,433 B2
(45) Date of Patent: Nov. 19, 2013

(54) COMPOUND SEMICONDUCTOR DEVICE AND MANUFACTURING METHOD THEREOF

(75) Inventors: Yuichi Minoura, Zama (JP); Toshihide Kikkawa, Machida (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 13/493,293

(22) Filed: Jun. 11, 2012

(65) Prior Publication Data
US 2012/0241758 A1    Sep. 27, 2012

Related U.S. Application Data

(63) Continuation of application No. PCT/JP2009/071227, filed on Dec. 21, 2009.

(51) Int. Cl.
*H01L 21/336*   (2006.01)

(52) U.S. Cl.
USPC ............. 438/268; 438/172; 257/76; 257/615; 257/E21.41; 257/E21.085

(58) Field of Classification Search
USPC .................. 438/268, 172; 257/615, E29.176, 257/E21.41, E21.085
See application file for complete search history.

(56) References Cited

U.S. PATENT DOCUMENTS

| | | | |
|---|---|---|---|
| 5,780,878 A | 7/1998 | Bhatnagar | |
| 7,329,909 B2 * | 2/2008 | Saito et al. | 257/192 |
| 7,510,938 B2 * | 3/2009 | de Fresart | 438/273 |
| 8,008,749 B2 * | 8/2011 | Sugimoto et al. | 257/615 |
| 2006/0170003 A1 | 8/2006 | Saito | |
| 2007/0052058 A1 * | 3/2007 | Hirler et al. | 257/492 |
| 2008/0128862 A1 | 6/2008 | Sugimoto | |
| 2009/0050932 A1 | 2/2009 | Lu | |

FOREIGN PATENT DOCUMENTS

| | | |
|---|---|---|
| JP | 8-97413 | 4/1996 |
| JP | 10-93087 | 4/1998 |
| JP | 2006-140368 A1 | 6/2006 |
| JP | 2006-216671 A1 | 8/2006 |
| JP | 2006-313859 A1 | 11/2006 |
| JP | 2008-42080 A1 | 2/2008 |
| JP | 2008-532257 A1 | 8/2008 |
| JP | 2009-43952 A1 | 2/2009 |

OTHER PUBLICATIONS

International Preliminary Examination Report mailed Jul. 19, 2012 in counterpart application No. PCT/JP2009/071227.

(Continued)

*Primary Examiner* — Jarrett Stark
*Assistant Examiner* — Shahed Ahmed
(74) *Attorney, Agent, or Firm* — Kratz, Quintos & Hanson, LLP

(57) ABSTRACT

A compound semiconductor device is provided with a first nitride semiconductor layer of a first conductivity type, a second nitride semiconductor layer of the first conductivity type which is formed over the first nitride semiconctor layer and being in contact with the first nitride semiconductor layer, a third nitride semiconductor layer of a second conductivity type being in contact with the second nitride semiconductor layer, a fourth nitride semiconductor layer of the first conductivity type being in contact with the third nitride semiconductor layer, and an insulating film insulating the first nitride semiconductor layer and the fourth nitride, semiconductor layer from each other. A source electrode is positioned inside an Outer edge of the insulating film in planar view.

16 Claims, 9 Drawing Sheets

(56) References Cited

OTHER PUBLICATIONS

H. Otake, et al.; "Vertical GaN-Based Trench Gate Metal Oxide Semiconductor Field-Effect Transistors on GaN Bulk Substrates;" Applied Physics Express; vol. 1; 2008; pp. 011105-1-011105-3/p. 2 of specification.

M. Kodama, et al.; "GaN-Based Trench Gate Metal Oxide Semiconductor Field-Effect Transistor Fabricated with 12 Novel Wet Etching;" Applied Physics Express; vol. 1; 2008; pp. 021104-1-021104-3/p. 2 of specification.

International Search Report for International Application PCT/JP2009/071227 dated Mar. 30, 2010.

* cited by examiner

ON-CURRENT

COMPOUND SEMICONDUCTOR DEVICE AND MANUFACTURING METHOD THEREOF

CROSS-REFERENCE TO RELATED APPLICATION

This application is a continuation application of International Application PCT/JP2009/071227 filed on Dec. 21, 2009 and designated the U.S., the entire contents of which are incorporated herein by reference.

FIELD

The present invention relates to a compound semiconductor device and a manufacturing method thereof.

BACKGROUND

GaN has been expected as a material of power device for the next generation with high breakdown voltage and low on-resistance. This is because GaN has characteristics such that a band gap is wide and a dielectric breakdown voltage is high.

As an example of power device using GaN, there is a vertical MOS (metal-oxide-semiconductor) FET (field effect transistor).

However, in a conventional vertical MOSFET, there is a problem that a threading dislocation exists in crystal of GaN between a source and a drain, and a leak current flows by taking the dislocation as a leak path.

Patent Literature 1: Japanese Laid-open Patent Publication No. 2006-313859

NON PATENT LITERATURE

Non Patent Literature 1: Ohtake, Appl. Phys. Express1 (2008) 011105

Non Patent Literature 2: Kodama, Appl. Phys. Express1 (2008) 021104

SUMMARY

An aspect of a compound semiconductor device is provided with a first nitride semiconductor layer of a first conductivity type, a second nitride semiconductor layer of the first conductivity type formed over the first nitride semiconductor layer and being in contact with the first nitride semiconductor layer, a third nitride semiconductor layer of a second conductivity type being in contact with the second nitride semiconductor layer, and a fourth nitride semiconductor layer of the first conductivity type being in contact with the third nitride semiconductor layer. Further, the aspect of a compound semiconductor device is provided with an insulating film insulating the first nitride semiconductor layer and the fourth nitride semiconductor layer from each other, a drain electrode formed on a rear surface of the first nitride semiconductor layer, a source electrode formed on the fourth nitride semiconductor layer, and a gate electrode formed above the third nitride semiconductor layer across a gate insulating film. The source electrode is positioned inside an outer edge of the insulating film in planar view.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS (First Embodiment)

Figure 1:
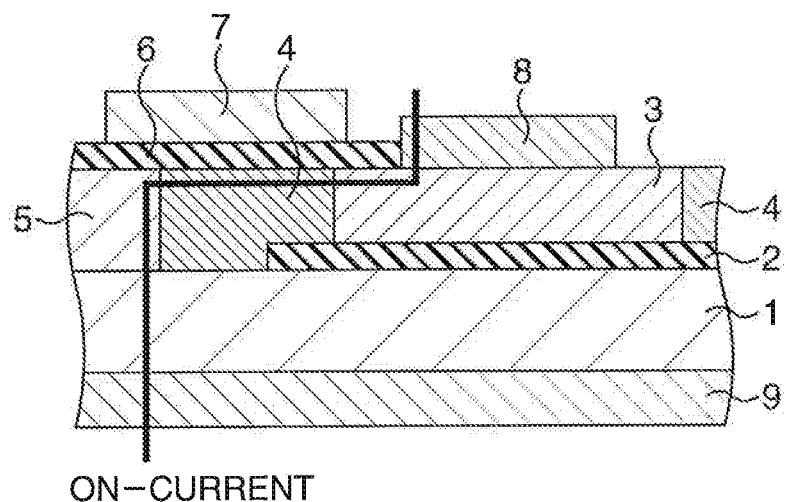
FIG. 1 is a sectional view illustrating a compound semiconductor device according to a first embodiment.

First, a first embodiment will be described. FIG. 1 is a sectional view illustrating a compound semiconductor device (GaN-based vertical MOSFET) according to the first embodiment.

In the first embodiment, as illustrated in FIG. 1, an insulating film 2 is formed on a nitride semiconductor layer 1 of a first conductivity type (first nitride semiconductor layer), and a nitride semiconductor layer 3 of the first conductivity type (fourth nitride semiconductor layer) is formed on the insulating film 2. On the nitride semiconductor layer 1, a nitride semiconductor layer 5 of the first conductivity type (second nitride semiconductor layer) is also formed. Further, a nitride semiconductor layer 4 of a second conductivity type (third nitride semiconductor layer) is formed between the nitride semiconductor layer 3 and the nitride semiconductor layer 5. At least, the nitride semiconductor layer 5 is in directly contact with the nitride semiconductor layer 1, and the nitride semiconductor layers 3 and 5 are in directly contact with the nitride semiconductor layer 4. Further, on the nitride semiconductor layer 4, there is formed, via a gate insulating film 6, a gate electrode 7 that controls an electric potential of the nitride semiconductor layer 4. Further, a source electrode 8 is formed on the nitride semiconductor layer 3, and a drain electrode 9 is formed on a rear surface of the nitride semiconductor layer 1. The source electrode 8 is positioned inside an outer edge of the insulating film 2 in planar view.

In the first embodiment structured as described above, the nitride semiconductor layer 1 functions as a drain region, and the nitride semiconductor layer 3 functions as a source region. Further, the nitride semiconductor layer 4 functions as a well region, and the nitride semiconductor layer 5 functions as a drift region. Therefore, an on-current flowed into the source electrode 8 flows into a surface layer portion of the nitride semiconductor layer 5 from a region of the source electrode 8 close to the gate electrode 7 via a region in the vicinity of a surface of the nitride semiconductor layer 3 and a region in the vicinity of a surface of the nitride semiconductor layer 4, and flows through a region in the vicinity of an interface of the nitride semiconductor layer 5 with the nitride semiconductor layer 4 to reach the nitride semiconductor layer 1. Then, the on-current flows out from the drain electrode 9. Thus, the on-current flows between the source and the drain.

Further, since the insulating film 2 is positioned between the source electrode 8 and the drain electrode 9, even if a threading dislocation that threads through the nitride semiconductor layer 1 in a longitudinal direction, and a threading dislocation that threads through the nitride semiconductor layer 3 in a longitudinal direction exist, there exists no threading dislocation that threads through both of the nitride semiconductor layer 1 and the nitride semiconductor layer 3. Although there is a chance that, depending on a method of forming the nitride semiconductor layer 4, a threading dislocation that threads through the nitride semiconductor layer 1 and the nitride semiconductor layer 4 may exist outside the insulating film 2 in planar view, this threading dislocation cannot be existed on a straight line connecting the source electrode 8 and the drain electrode 9. Therefore, even if this threading dislocation functions as a leak path of leak current, an amount of the flowing leak current is very small.

As described above, according to the present embodiment, it is possible to suppress the leak current between the source electrode 8 and the drain electrode 9. Further, it is also possible to increase a breakdown voltage along with the suppression of leak current.

(Second Embodiment)

Figure 2:
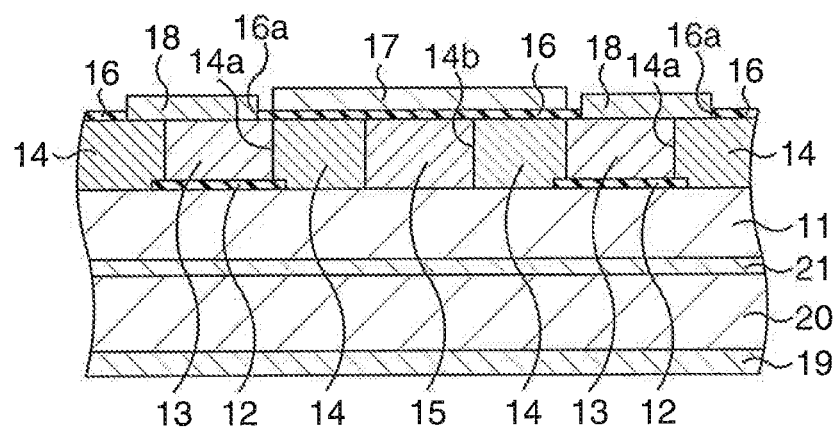
FIG. 2 is a sectional view illustrating a compound semiconductor device according to a second embodiment.

Next, a second embodiment will be described. FIG. 2 is a sectional view illustrating a compound semiconductor device (GaN-based vertical MOSFET) according to the second embodiment.

In the second embodiment, as illustrated in FIG. 2, an n-type buffer layer 21 is formed on an n-type conductive substrate 20. As the n-type conductive substrate 20, an n-type GaN substrate, an n-type SiC substrate, an n-type Si substrate or the like is used, for example. A carrier concentration of the conductive substrate is preferably $1 \times 10^{18}$ cm$^{-3}$ or more. This is for securing favorable conductivity. As the n-type buffer layer 21, for example, an n$^+$GaN layer in which Si is doped at a concentration of about $5 \times 10^{18}$ cm$^{-3}$ is used. A thickness of the buffer layer 21 is about 100 nm. An n-type semiconductor layer 11 is formed on the buffer layer 21. As the n-type semiconductor layer 11, for example, an n-type GaN layer in which Si is doped at a concentration of about $1 \times 10^{17}$ cm$^{-3}$ is used. A thickness of the semiconductor layer 11 is about 5 μm.

An n-type semiconductor layer 15 is formed on the semiconductor layer 11. As the n-type semiconductor layer 15, for example, an n$^+$GaN layer in which Si is doped at a concentration of about $5 \times 10^{18}$ cm$^{-3}$ is used. Further, p-type semiconductor layers 14 are formed so as to sandwich the semiconductor layer 15 on the semiconductor layer 11. As the p-type semiconductor layer 14, for example, a p-type GaN layer in which Mg is doped at a concentration of about $5 \times 10^{19}$ cm$^{-3}$ is used. Further, n-type semiconductor layers 13 are formed above the semiconductor layer 11 across an insulating film 12, so as to sandwich the semiconductor layers 14 and 15. As the n-type semiconductor layer 13, for example, an n$^+$GaN layer in which Si is doped at a concentration of about $5 \times 10^{18}$ cm$^{-3}$ is used. As the insulating film 12, for example, a silicon oxide film or a silicon nitride film is used. A thickness of the insulating film 12 is about 200 nm, a thickness of the semiconductor layer 13 is about 800 nm, and a thickness of each of the semiconductor layers 14 and 15 is about 1 μm.

A gate insulating film 16 is formed on the semiconductor layers 13, 14 and 15. An opening 16a exposing at least a part of the semiconductor layer 13 is formed in the gate insulating film 16. As the gate insulating film 16, a silicon oxide film, a silicon nitride film, a hafnium oxide film or the like is used, for example. A thickness of the gate insulating film 16 is about 100 nm. A source electrode 18 is formed in the opening 16a. Further, a gate electrode 17 is formed above the semiconductor layer 14 across the gate insulating film 16. Furthermore, a drain electrode 19 is formed on a rear surface of the conductive substrate 20. The source electrode 18 includes a Ti film and an Al film on the Ti film. A thickness of the Ti film is about 30 nm, and a thickness of the Al film is about 100 nm. The gate electrode 17 includes a Ni film and a Au film on the Ni film. A thickness of the Ni film is about 10 nm, and a thickness of the Au film is about 200 nm. The drain electrode 19 includes a Ti film in contact with the conductive substrate 20 and an Al film positioned under the Ti film. A thickness of the Ti film is about 30 nm, and a thickness of the Al film is about 100 nm.

In the second embodiment structured as described above, the conductive substrate 20, the buffer layer 21 and the semiconductor layer 11 function as a drain region, and the semiconductor layer 13 functions as a source region. Further, the semiconductor layer 14 functions as a well region, and the semiconductor layer 15 functions as a drift region. Therefore, an on-current flowed into the source electrode 18 flows into a surface layer portion of the semiconductor layer 15 from a region of the source electrode 18 close to the gate electrode 17 via a region in the vicinity of a surface of the semiconductor layer 13 and a region in the vicinity of a surface of the semiconductor layer 14, and flows through a region in the vicinity of an interface of the semiconductor layer 15 with the semiconductor layer 14 to reach the conductive substrate 20, the buffer layer 21 and the semiconductor layer 11. Then, the on-current flows out from the drain electrode 19. Thus, the on-current flows between the source and the drain.

Next, a manufacturing method of the compound semiconductor device according to the second embodiment will be described. FIG. 3A to FIG. 3H are sectional views illustrating the manufacturing method of the compound semiconductor device according to the second embodiment, in the order of processes.

Figure 3A:
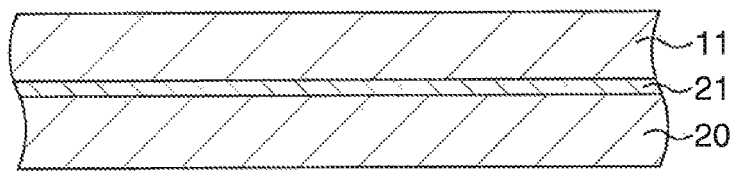
FIG. 3A is a sectional view illustrating a manufacturing method of the compound semiconductor device according to the second embodiment.

First, as illustrated in FIG. 3A, the buffer layer 21 and the semiconductor layer 11 are formed in this order on the conductive substrate 20, by a crystal growth method such as an NOCVD (metal organic chemical vapor deposition) method.

Figure 3B:
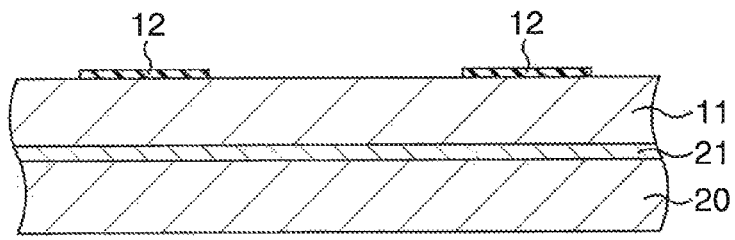
FIG. 3B is a sectional view illustrating the manufacturing method of the compound semiconductor device continued from FIG. 3A.

Subsequently, an insulating film is formed on the semiconductor layer 11 by a sputtering method, a CVD method or the like, and patterning of the insulating film is performed, thereby forming the insulating film 12, as illustrated in FIG. 3B. As the patterning of the insulating film, wet etching using a solution containing hydrofluoric acid or the like is performed, for example.

Figure 3C:
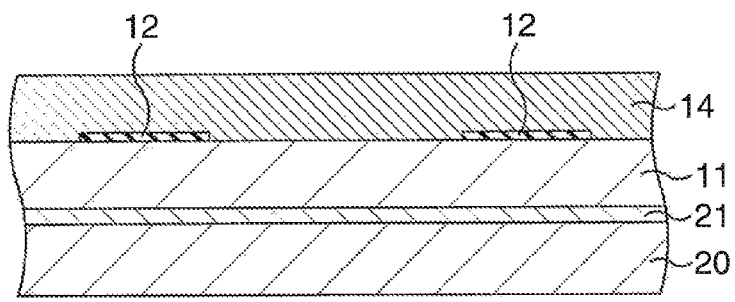
FIG. 3C is a sectional view illustrating the manufacturing method of the compound semiconductor device continued from FIG. 3B.

After that, as illustrated in FIG. 3C, the semiconductor layer 14 is formed on the semiconductor layer 11 by a crystal growth method such as the MOCVD method or an HVPE (hydride vapor phase epitaxy) method under a condition where a lateral crystal growth dominantly proceeds compared to a vertical crystal growth. Specifically, the semiconductor layer 14 is formed by an ELO (epitaxial lateral growth) technique. Dislocations in the semiconductor layer 14 formed through the lateral crystal growth occur in a concentrated manner mainly in a portion above the insulating film 12. This is because the semiconductor layer 14 starts to grow from a surface of the semiconductor layer 11, and at a portion above the insulating film 12, portions of the semiconductor layer 14 grown from both sides of the insulating film 12 are integrated. Further, since the semiconductor layer 14 is laterally crystal-grown, no threading dislocation that threads through both of the semiconductor layer 11 and the semiconductor layer 14 occurs. After the formation of the semiconductor layer 14, there is conducted heat treatment at 600° C. for 30 minutes, for example, in order to activate an impurity (Mg, for example) contained in the semiconductor layer 14.

Figure 3D:
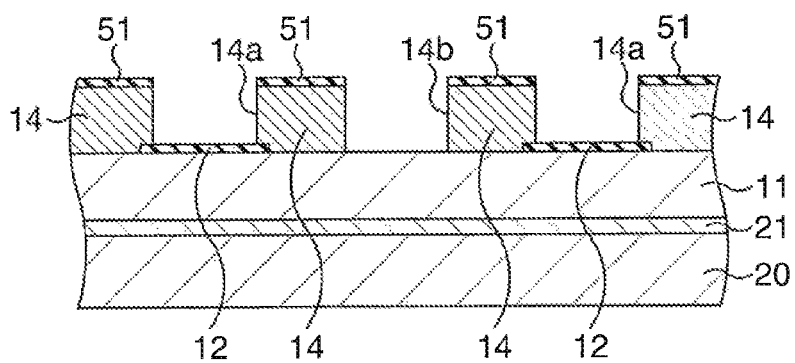
FIG. 3D is a sectional view illustrating the manufacturing method of the compound semiconductor device continued from FIG. 3C.

Subsequently, as illustrated in FIG. 3D, a mask 51 which has openings in regions where the semiconductor layers 13 and 15 are to be formed is formed on the semiconductor layer 14. As the mask 51, for example, a hard mask such as a silicon oxide film is used. Next, by dry etching of the semiconductor layer 14 with using the mask 51 as an etching mask, an opening 14a (first opening) is formed in the region where the semiconductor layer 13 is to be formed, and an opening 14b (second opening) is formed in the region where the semiconductor layer 15 is to be formed. In the dry etching, $Cl_2$ gas, for example, is used as etching gas. As a result of forming the opening 14a, a large part of the region of the semiconductor layer 14 in which the dislocations have been occurred in a concentrated manner is removed.

Figure 3E:
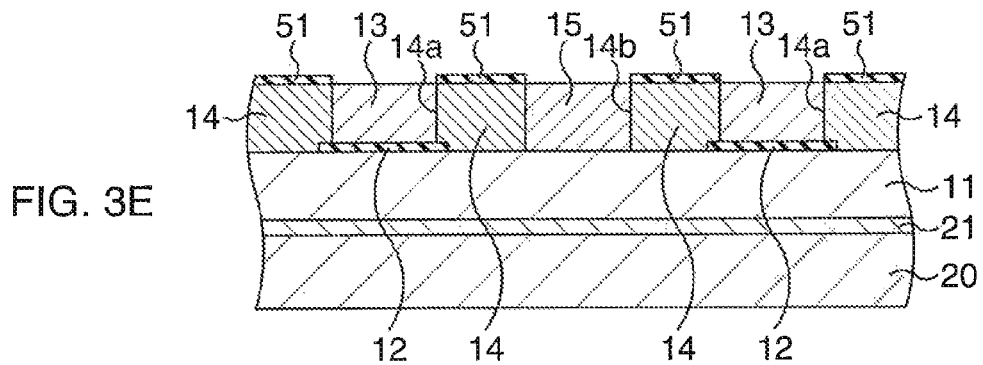
FIG. 3E is a sectional view illustrating the manufacturing method of the compound semiconductor device continued from FIG. 3D.
Figure 4A:
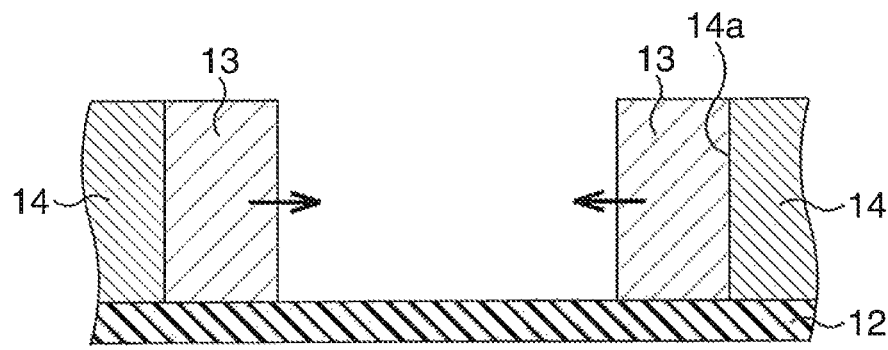
FIG. 4A is a sectional view illustrating a method of forming a semiconductor layer 13.
Figure 4B:
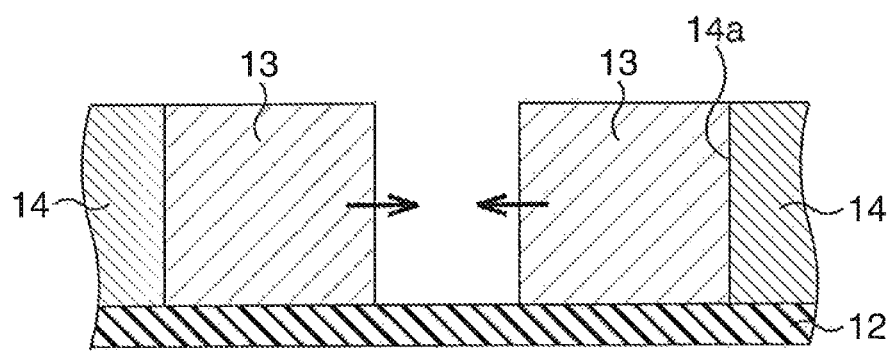
FIG. 4B is a sectional view illustrating the method of forming the semiconductor layer 13 continued from FIG. 4A.
Figure 4C:
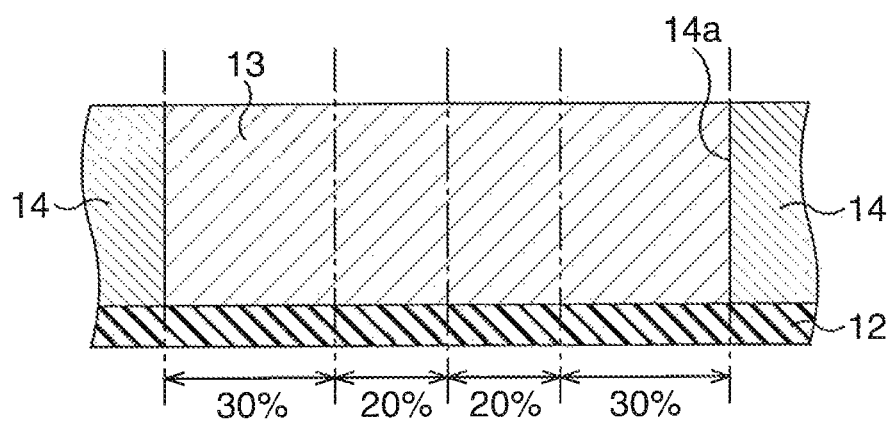
FIG. 4C is a sectional view illustrating the method of forming the semiconductor layer 13 continued from FIG. 4B.

After that, as illustrated in FIG. 3E, the semiconductor layer 13 is made to grow in the opening 14a, and the semiconductor layer 15 is made to grow in the opening 14b, with using the mask 51 as a growth mask. At this time, since the insulating film 12 exists on the bottom of the opening 14a, the semiconductor layer 13 starts to grow in a lateral direction from side surfaces of the semiconductor layer 14, as illustrated in FIG. 4A. Even after that, the semiconductor layer 13 continues to grow in the lateral direction, as illustrated in FIG. 4B. Subsequently, as illustrated in FIG. 4C, portions of the semiconductor layer 13 grown from respective directions are integrated at a center of the opening 14a. Thus, the semiconductor layer 13 is formed through the lateral crystal growth. Since a dislocations in the semiconductor layer 13 are likely to occur in a concentrated manner in a growth end, there exists, in a center portion of the semiconductor layer 13 in planar view, a dislocation concentrated region having a dislocation density higher than that of a periphery of the center portion. The dislocation concentrated region may be at least positioned in a certain region surrounded by a certain surface. Here, the certain surface is a whole series of points each of which divides a line segment connecting the center of the semiconductor layer 13 in planar view and the boundary between the semiconductor layer 13 and the semiconductor layer 14 in a ratio of 2:3. Although it is not required to particularly control a growth direction of the semiconductor layer 15, it is preferable to form the semiconductor layer 15 through the lateral crystal growth. This is because, when it is set that the lateral crystal growth dominantly proceeds, dislocations are likely to occur in a concentrated manner in a center portion in planar view, similar to the semiconductor layer 13, which lowers a dislocation density in the region in the vicinity of the interface of the semiconductor layer 15 with the semiconductor layer 14 in which a path of on-current is included.

Figure 3F:
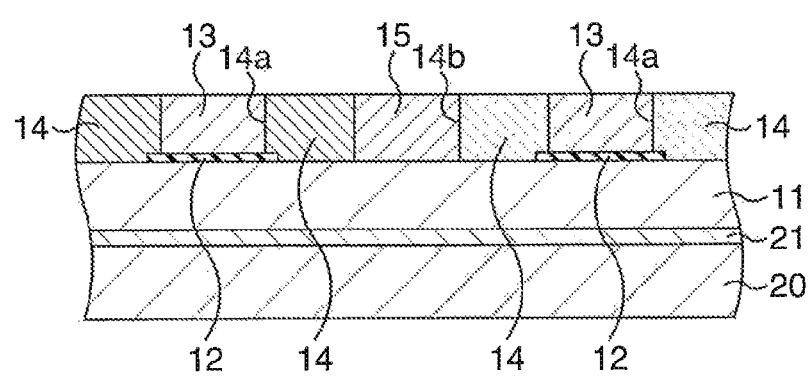
FIG. 3F is a sectional view illustrating the manufacturing method of the compound semiconductor device continued from FIG. 3E.

After the semiconductor layer 13 and the semiconductor layer 15 are formed, the mask 51 is removed, as illustrated in FIG. 3F. The mask 51 may be removed by a solution containing hydrofluoric acid, for example.

Figure 3G:
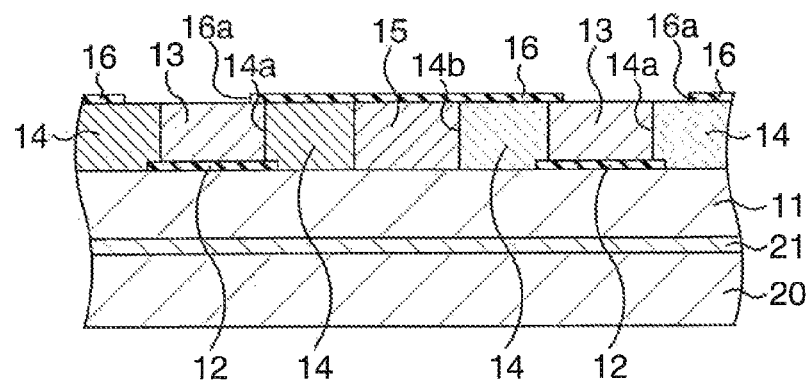
FIG. 3G is a sectional view illustrating the manufacturing method of the compound semiconductor device continued from FIG. 3F.

Next, as illustrated in FIG. 3G, the gate insulating film 16 is formed on the semiconductor layers 13, 14 and 15, and the opening 16a exposing at least a part of the semiconductor layer 13 is formed in the gate insulating film 16. At this time, an end portion on the semiconductor layer 15 side of the opening 16a may be set to a position on a side of the semiconductor layer 15 with respect to the dislocation concentrated region of the semiconductor layer 13.

Figure 3H:
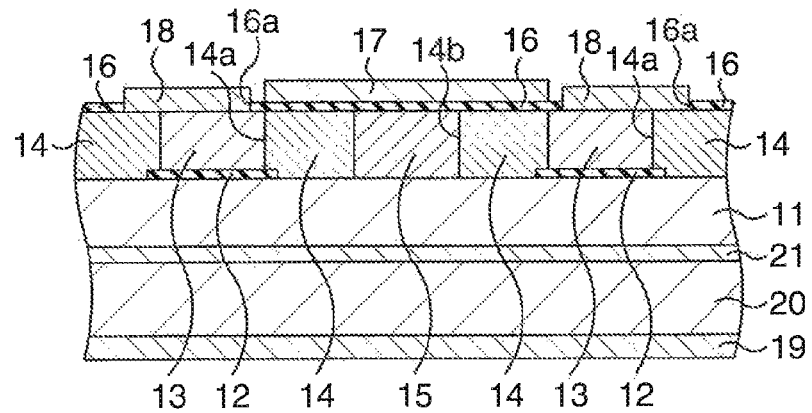
FIG. 3H is a sectional view illustrating the manufacturing method of the compound semiconductor device continued from FIG. 3G.

Thereafter, as illustrated in FIG. 3H, the source electrode 18 is formed in the opening 16a, and the drain electrode 19 is formed on the rear surface of the conductive substrate 20. As the source electrode 18, a multi-layered body of a Ti film and an Al film is formed by a lift-off method, for example. Further, as the drain electrode 19, a multi-layered body of a Ti film and an Al film is formed, for example. The Ti films and Al films are formed by a vapor deposition method, for example. After forming these multi-layered bodies, heat treatment at 600° C., for example, is conducted to establish ohmic contact. After performing the heat treatment, the gate electrode 17 is formed on the gate insulating film 16. As the gate electrode 17, a multi-layered body of a Ni film and a Au film is formed by the lift-off method, for example. The Ni film and the Au film are formed by the vapor deposition method, for example.

As described above, the compound semiconductor device (GaN-based vertical MOSFET) according to the second embodiment may be manufactured.

Further, in the second embodiment as described above, it is possible to suppress a leak current, similar to the first embodiment. Further, since the dislocation density in the path of the on-current is low, it is possible to reduce the on-resistance and to improve reliability.

(Third Embodiment)

Figure 5:
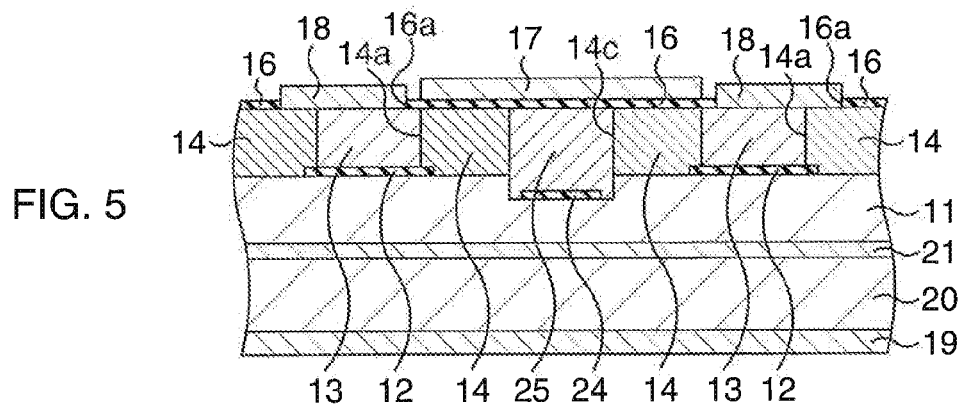
FIG. 5 is a sectional view illustrating a compound semiconductor device according to a third embodiment.

Next, a third embodiment will be described. FIG. 5 is a sectional view illustrating a compound semiconductor device (GaN-based vertical MOSFET) according to the third embodiment.

In the third embodiment, as illustrated in FIG. 5, a bottom surface of an opening 14c is positioned lower than a boundary between the semiconductor layer 11 and the semiconductor layer 14. Further, a growth mask 24 is formed on a bottom portion of the opening 14c away from side surfaces of the opening 14c. As the growth mask 24, for example, there is used an insulating film such as a silicon oxide and a silicon nitride film, or a refractory metal film or a nitride film thereof such as a tungsten film, a tungsten nitride film, a titanium film, a titanium nitride film, a molybdenum film, a tantalum film and a tantalum nitride film. Further, an n-type semiconductor layer 25 is formed in the opening 14c through the lateral crystal growth instead of the semiconductor layer 15. As the n-type semiconductor layer 25, for example, an n$^+$GaN layer in which Si is doped at a concentration of about $5\times10^{18}$ cm$^{-3}$ is used. The other structure is similar to the structure of the second embodiment.

In the third embodiment structured as described above, the semiconductor layer 25 functions as a drift region.

Next, a manufacturing method of the compound semiconductor device according to the third embodiment will be described. FIG. 6A to FIG. 6H are sectional views illustrating the manufacturing method of the compound semiconductor device according to the third embodiment, in the order of processes.

Figure 6A:
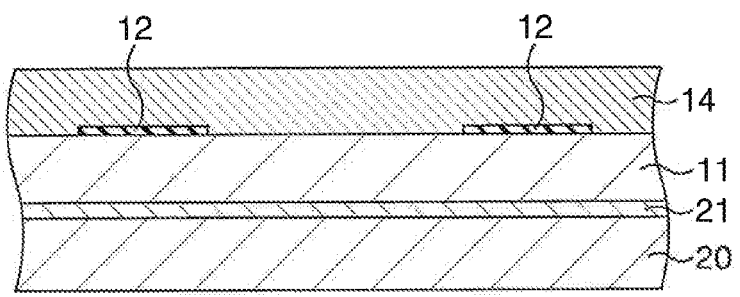
FIG. 6A is a sectional view illustrating a manufacturing method of the compound semiconductor device according to the third embodiment.

First, as illustrated in FIG. 6A, processes up to the formation of the semiconductor layer 14 are conducted, in a similar manner to the first embodiment.

Figure 6B:
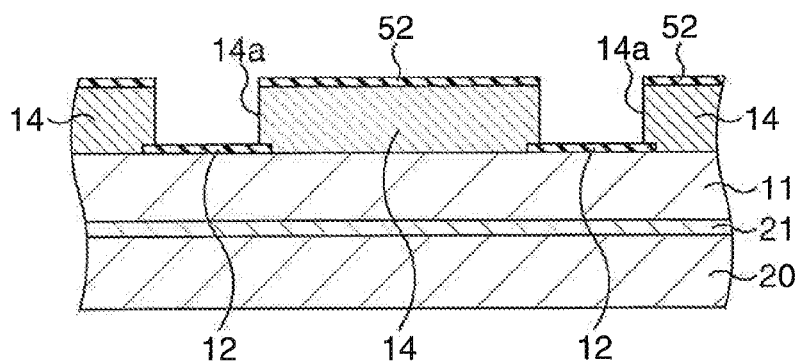
FIG. 6B is a sectional view illustrating the manufacturing method of the compound semiconductor device continued from FIG. 6A.

Next, as illustrated in FIG. 6B, a mask 52 which has an opening in a region where the semiconductor layer 13 is to be formed is formed on the semiconductor layer 14. As the mask 52, for example, a hard mask such as a silicon oxide film is used. After that, by dry etching of the semiconductor layer 14 with using the mask 52 as an etching mask, the opening 14a is formed in the region where the semiconductor layer 13 is to be formed.

Figure 6C:
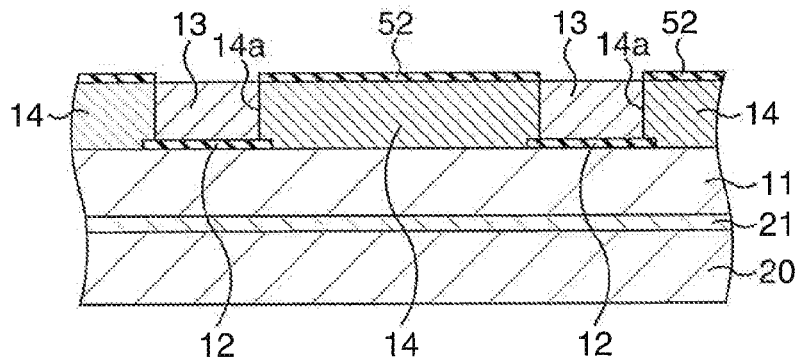
FIG. 6C is a sectional view illustrating the manufacturing method of the compound semiconductor device continued from FIG. 6B.

Subsequently, as illustrated in FIG. 6C, the semiconductor layer 13 is made to grow in the opening 14a with using the mask 52 as a growth mask.

Figure 6D:
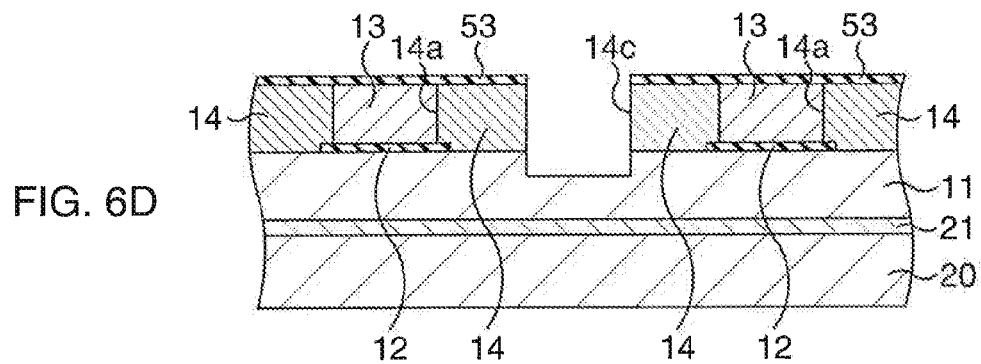
FIG. 6D is a sectional view illustrating the manufacturing method of the compound semiconductor device continued from FIG. 6C.

Next, as illustrated in FIG. 6D, the mask 52 is removed, and a mask 53 which has an opening in a region where the semiconductor layer 15 is to be formed is formed on the semiconductor layers 13 and 14. The mask 52 may be removed by a solution containing hydrofluoric acid, for example. As the mask 53, for example, a hard mask such as a silicon oxide film is used. After that, by dry etching of the semiconductor layer 14 with using the mask 53 as an etching mask, the opening 14c (second opening) is formed in a region where the semiconductor layer 25 is to be formed. At this time, the bottom surface of the opening 14c is positioned lower than the boundary between the semiconductor layer 14 and the semiconductor layer 11.

Figure 6E:
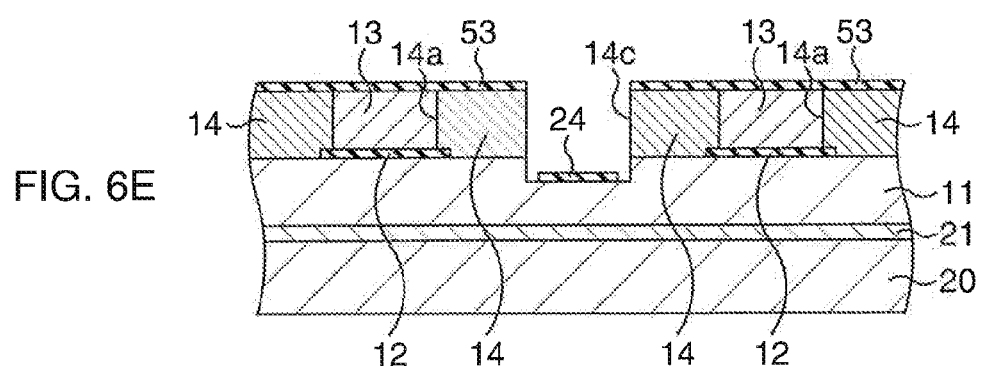
FIG. 6E is a sectional view illustrating the manufacturing method of the compound semiconductor device continued from FIG. 6D.

Subsequently, as illustrated in FIG. 6E, the growth mask 24 separated from the side surfaces of the opening 14c is formed on the bottom surface of the opening 14c. A thickness of the growth mask 24 is set to about 100 nm.

Figure 6F:
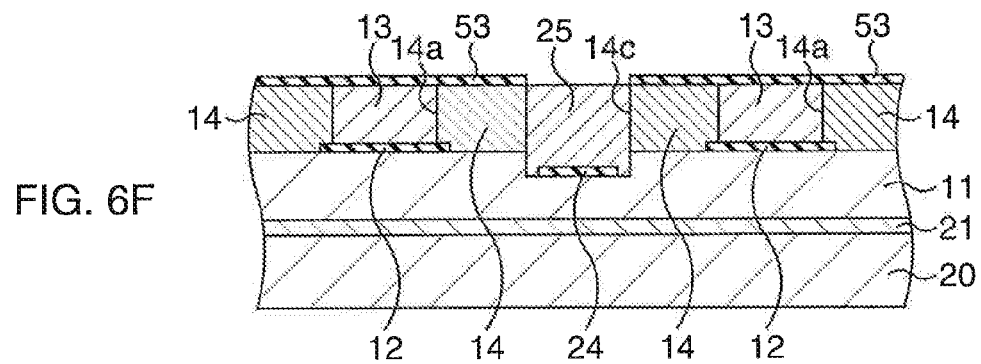
FIG. 6F is a sectional view illustrating the manufacturing method of the compound semiconductor device continued from FIG. 6E.

Next, as illustrated in FIG. 6F, the semiconductor layer 25 is made to grow in the opening 14c with using the mask 53 as a growth mask. At this time, since the growth mask 24 exists on the bottom of the opening 14c, the semiconductor layer 25 starts to grow in a lateral direction from side surfaces of the semiconductor layer 14. Even after that, the semiconductor layer 25 continues to grow in the lateral direction. Subsequently, portions of the semiconductor layer 25 grown from respective directions are integrated at a center of the opening 14c. Thus, the semiconductor layer 25 is formed through the lateral crystal growth. Since dislocations in the semiconductor layer 25 are likely to occur in a concentrated manner in a growth end, there exists, in a center portion of the semiconductor layer 25 in planar view, a dislocation concentrated region having a dislocation density higher than that of a periphery of the center portion.

Figure 6G:
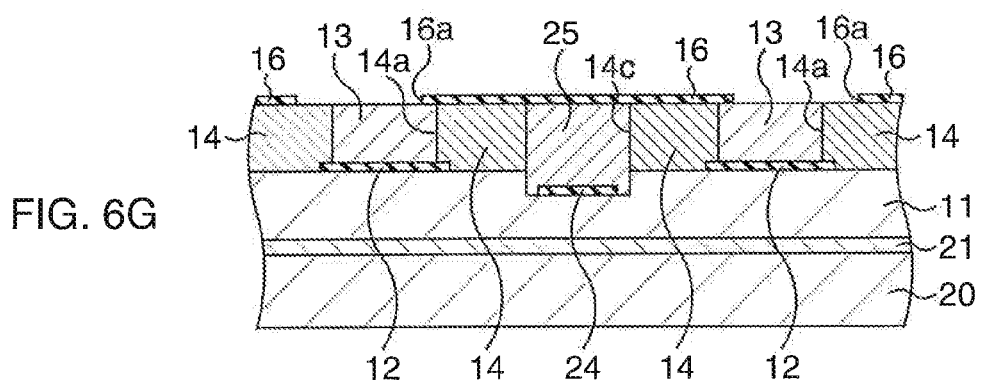
FIG. 6G is a sectional view illustrating the manufacturing method of the compound semiconductor device continued from FIG. 6F.

After the formation of the semiconductor layer 25, the mask 53 is removed, as illustrated in FIG. 6G. The mask 53 may be removed by a solution containing hydrofluoric acid, for example. Next, the gate insulating film 16 is formed on the semiconductor layers 13, 14 and 25, and the opening 16a exposing at least a part of the semiconductor layer 13 is formed in the gate insulating film 16.

Figure 6H:
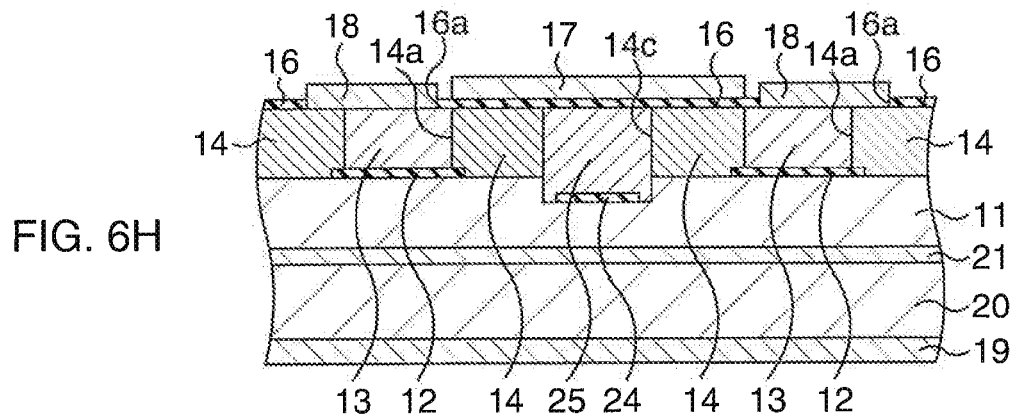
FIG. 6H is a sectional view illustrating the manufacturing method of the compound semiconductor device continued from FIG. 6G.

Thereafter, as illustrated in FIG. 6H, processes from the formation of the source electrode 18 to the formation of the gate electrode 17 are conducted, in a similar manner to the second embodiment.

As described above, the compound semiconductor device (GaN-based vertical MOSFET) according to the third embodiment may be manufactured.

Further, also in the third embodiment as described above, it is possible to suppress a leak current. Besides, it is possible to easily reduce a dislocation in a part of the drift region (semiconductor layer 25) in which the on-current flows.

(Fourth Embodiment)

Figure 7:
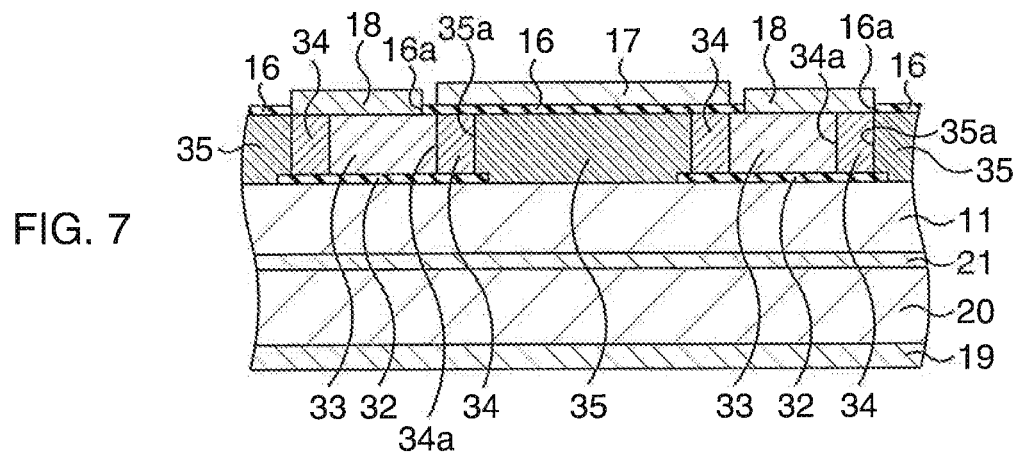
FIG. 7 is a sectional view illustrating a compound semiconductor device according to a fourth embodiment.

Next, a fourth embodiment will be described. FIG. 7 is a sectional view illustrating a compound semiconductor device (GaN-based vertical MOSFET) according to the fourth embodiment.

In the fourth embodiment, an n-type semiconductor layer 35 is formed on the semiconductor layer 11. As the n-type semiconductor layer 35, for example, an n$^-$GaN layer in which Si is doped at a concentration of about $1\times10^{17}$ cm$^{-3}$ is used. Further, p-type semiconductor layers 34 are formed so as to sandwich the semiconductor layer 35 above the semiconductor layer 11 across an insulating film 32. As the p-type semiconductor layer 34, for example, a p-type GaN layer in which Mg is doped at a concentration of about $5\times10^{19}$ cm$^{-3}$ is used. Furthermore, n-type semiconductor layers 33 are formed so as to sandwich the semiconductor layers 34 and 35 above the semiconductor layer 11 across the insulating film 32. As the n-type semiconductor layer 33, for example, an n+GaN layer in which Si is doped at a concentration of about $5 \times 10^{19}$ cm$^{-3}$ is used. As the insulating film 32, for example, a silicon oxide film or a silicon nitride film is used. A thickness of the insulating film 32 is about 200 nm, a thickness of each of the semiconductor layers 33 and 34 is about 800 nm, and a thickness of the semiconductor layer 35 is about 1 μm.

On the semiconductor layers 33, 34 and 35, the gate insulating film 16 is formed. The opening 16a exposing at least a part of the semiconductor layer 33 is formed in the gate insulating film 16. The source electrode 18 is formed in the opening 16a. Further, the gate electrode 17 is formed above the semiconductor layer 34 across the gate insulating film 16. Furthermore, the drain electrode 19 is formed on the rear surface of the conductive substrate 20.

In the fourth embodiment structured as described above, the semiconductor layer 33 functions as a source region. Further, the semiconductor layer 34 functions as a well region, and the semiconductor layer 35 functions as a drift region.

Next, a manufacturing method of the compound semiconductor device according to the fourth embodiment will be described. FIG. 8A to FIG. 8H are sectional views illustrating the manufacturing method of the compound semiconductor device according to the fourth embodiment, in the order of processes.

Figure 8A:
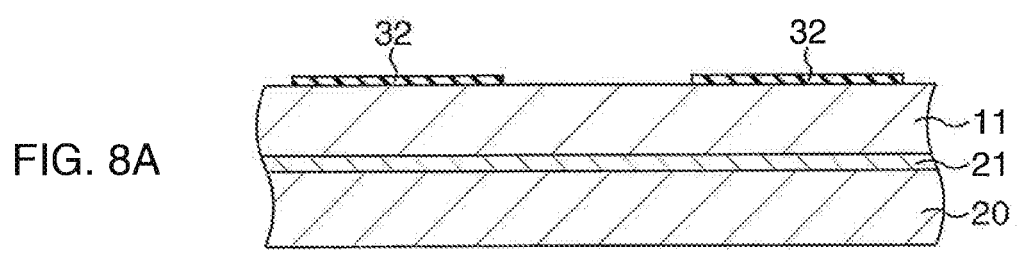
FIG. 8A is a sectional view illustrating a manufacturing method of the compound semiconductor device according to the fourth embodiment.

First, as illustrated in FIG. 8A, processes up to the formation of the semiconductor layer 11 are performed, in a similar manner to the first embodiment. Next, an insulating film is formed on the semiconductor layer 11 by a sputtering method, a CVD method or the like, and patterning of the insulating film is performed, thereby forming the insulating film 32. As the patterning of the insulating film, wet etching using a solution containing hydrofluoric acid or the like is performed, for example.

Figure 8B:
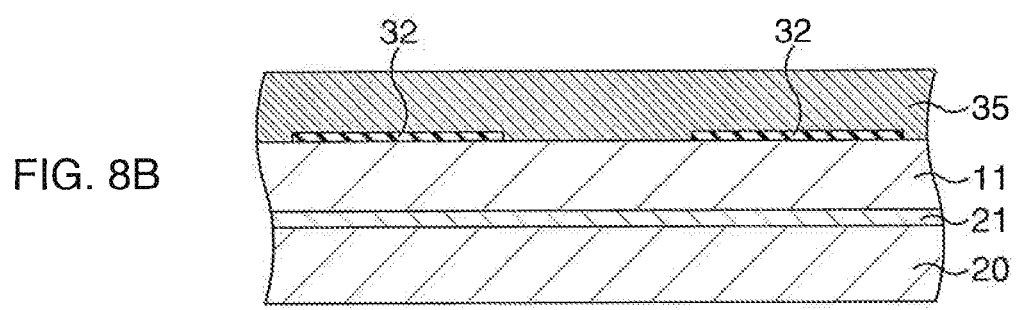
FIG. 8B is a sectional view illustrating the manufacturing method of the compound semiconductor device continued from FIG. 8A.

After that, as illustrated in FIG. 8B, the semiconductor layer 35 (fifth nitride semiconductor layer) is formed on the semiconductor layer 11 by a crystal growth method such as an MOCVD method or an HVPE method under a condition where a lateral crystal growth dominantly proceeds compared to a vertical crystal growth. Specifically, the semiconductor layer 35 is formed by an ELO technique. Dislocations in the semiconductor layer 35 formed through the lateral crystal growth occur in a concentrated manner mainly in a portion above the insulating film 32.

Figure 8C:
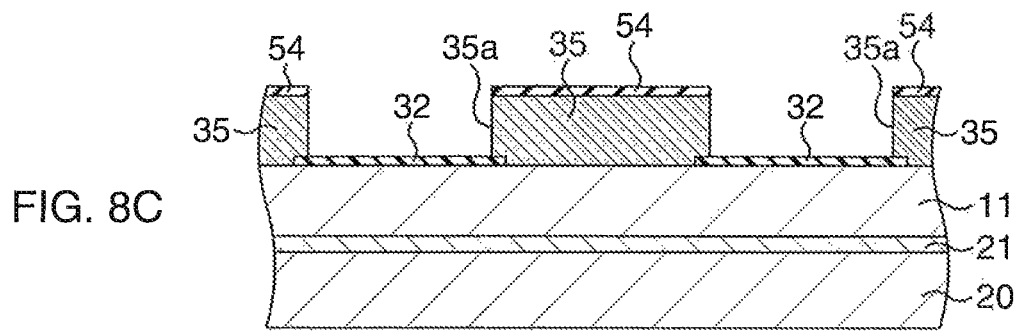
FIG. 8C is a sectional view illustrating the manufacturing method of the compound semiconductor device continued from FIG. 8B.

Subsequently, as illustrated in FIG. 8C, a mask 54 which has an opening in a region where the semiconductor layers 33 and 34 are to be formed is formed on the semiconductor layer 35. As the mask 54, for example, a hard mask such as a silicon oxide film is used. Next, by dry etching of the semiconductor layer 35 with using the mask 54 as an etching mask, an opening 35a (third opening) is formed in the region where the semiconductor layers 33 and 34 are to be formed. In the dry etching, Cl$_2$ gas, for example, is used as etching gas. As a result of forming the opening 35a, a large part of the region of the semiconductor layer 35 in which the dislocations have been occurred in a concentrated manner is removed.

Figure 8D:
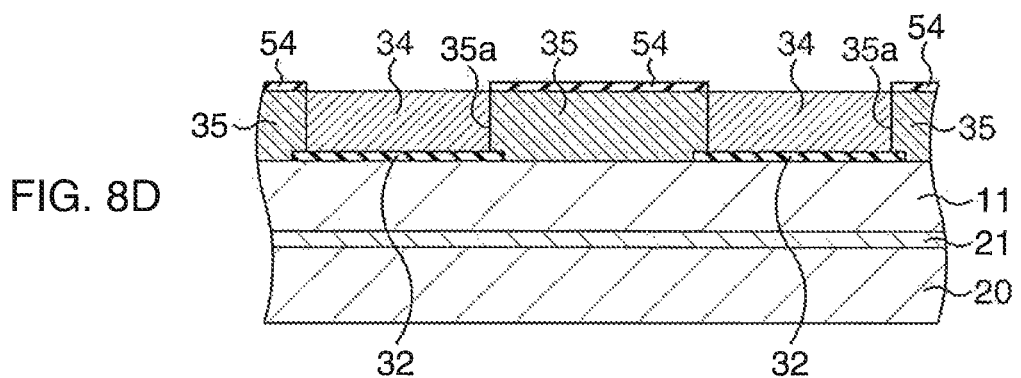
FIG. 8D is a sectional view illustrating the manufacturing method of the compound semiconductor device continued from FIG. 8C.

After that, as illustrated in FIG. 8D, using the mask 54 as a growth mask, the semiconductor layer 34 is made to grow in the opening 35a. At this time, since the insulating film 32 exists on the bottom of the opening 35a, the semiconductor layer 34 starts to grow in a lateral direction from side surfaces of the semiconductor layer 35. Even after that, the semiconductor layer 34 continues to grow in the lateral direction. Subsequently, portions of the semiconductor layer 34 grown from respective directions are integrated at a center of the opening 35a. Thus, the semiconductor layer 34 is formed through the lateral crystal growth. Since dislocations in the semiconductor layer 34 are likely to occur in a concentrated manner in a growth end, there exists, in a center portion of the semiconductor layer 34 in planar view, a dislocation concentrated region having a dislocation density higher than that of a periphery of the center portion.

Figure 8E:
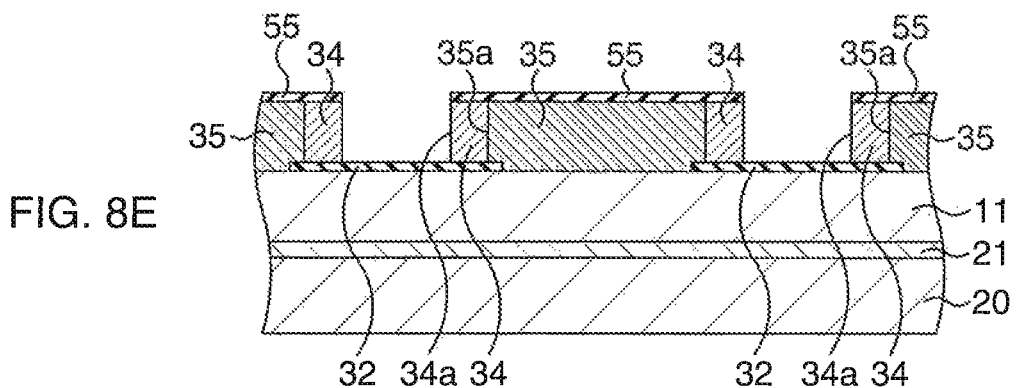
FIG. 8E is a sectional view illustrating the manufacturing method of the compound semiconductor device continued from FIG. 8D.

After the formation of the semiconductor layer 34, the mask 54 is removed, and a mask 55 which has an opening in a region where the semiconductor layer 33 is to be formed is formed on the semiconductor layers 34 and 35, as illustrated in FIG. 8E. The mask 54 may be removed by a solution containing hydrofluoric acid, for example. As the mask 55, for example, a hard mask such as a silicon oxide film is used. Next, by dry etching of the semiconductor layer 34 with using the mask 55 as an etching mask, an opening 34a is formed in a region where the semiconductor layer 33 is to be formed.

Figure 8F:
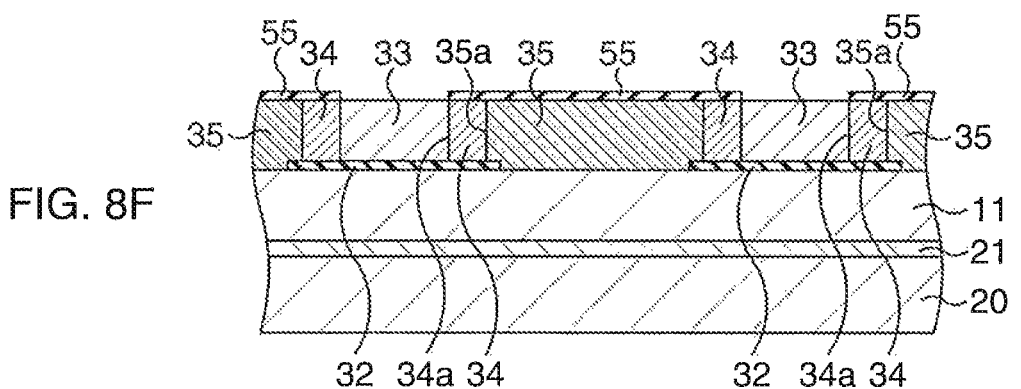
FIG. 8F is a sectional view illustrating the manufacturing method of the compound semiconductor device continued from FIG. 8E.

After that, as illustrated in FIG. 8F, the semiconductor layer 33 is made to grow in the opening 34a with using the mask 55 as a growth mask. At this time, since the insulating film 32 exists on the bottom of the opening 34a, the semiconductor layer 33 starts to grow in a lateral direction from side surfaces of the semiconductor layer 34. Even after that, the semiconductor layer 33 continues to grow in the lateral direction. Subsequently, portions of the semiconductor layer 33 grown from respective directions are integrated at a center of the opening 34a. Thus, the semiconductor layer 33 is formed through the lateral crystal growth. Since dislocations in the semiconductor layer 33 are likely to occur in a concentrated manner in a growth end, there exists, in a center portion of the semiconductor layer 33 in planar view, a dislocation concentrated region having a dislocation density higher than that of a periphery of the center portion.

Figure 8G:
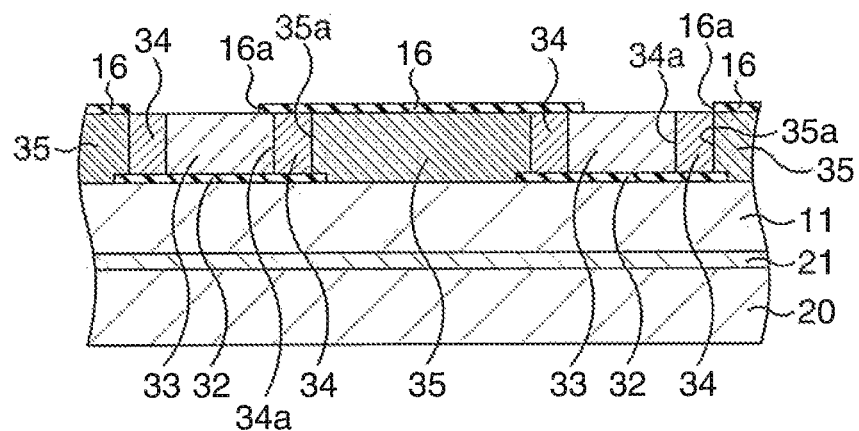
FIG. 8G is a sectional view illustrating the manufacturing method of the compound semiconductor device continued from FIG. 8F.

After the formation of the semiconductor layer 33, the mask 55 is removed, as illustrated in FIG. 8G. The mask 55 may be removed by a solution containing hydrofluoric acid, for example. Next, the gate insulating film 16 is formed on the semiconductor layers 33, 34 and 35, and the opening 16a exposing at least a part of the semiconductor layer 13 is formed in the gate insulating film 16.

Figure 8H:
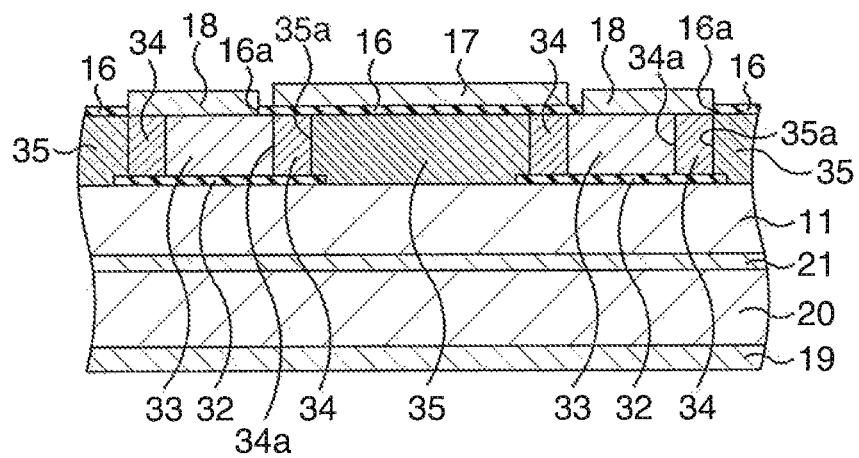
FIG. 8H is a sectional view illustrating the manufacturing method of the compound semiconductor device continued from FIG. 8G.

Thereafter, as illustrated in FIG. 8H, processes from the formation of the source electrode 18 to the formation of the gate electrode 17 are conducted, in a similar manner to the second embodiment.

As described above, the compound semiconductor device (GaN-based vertical MOSFET) according to the fourth embodiment may be manufactured.

Further, also in the fourth embodiment as described above, it is possible to suppress a leak current. Besides, since the etching for forming the drift region (semiconductor layer 35) is not performed, it is possible to reduce a dislocation on a path of leak current in the drift region.

Note that although the transistors in these embodiments are n-channel MOSFETs, it is also possible to structure p-channel MOSFETs by reversing the conductivity type of each semiconductor layer.

Further, as the nitride semiconductor, it is also possible to use AlGaN or the like, other than GaN.

According to these compound semiconductor device and manufacturing method thereof, it is possible to reduce the leak current by appropriately using the insulating film on the first nitride semiconductor layer.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a first nitride semiconductor layer of a first conductivity type;
   a second nitride semiconductor layer of the first conductivity type formed over the first nitride semiconductor layer and being in contact with the first nitride semiconductor layer;
   a third nitride semiconductor layer of a second conductivity type being in contact with the second nitride semiconductor layer;
   a fourth nitride semiconductor layer of the first conductivity type being in contact with the third nitride semiconductor layer;
   an insulating film insulating the first nitride semiconductor layer and the fourth nitride semiconductor layer from each other;
   a drain electrode formed on a rear surface of the first nitride semiconductor layer;
   a source electrode formed on the fourth nitride semiconductor layer; and
   a gate electrode formed above the third nitride semiconductor layer across a gate insulating film,
   wherein the source electrode is positioned inside an outer edge of the insulating film in planar view.

2. The compound semiconductor device according to claim 1, wherein
   the larger a distance is from a center of the fourth nitride semiconductor layer in planar view, the lower a dislocation density is in the fourth nitride semiconductor layer, and
   an end portion on the gate electrode side of the source electrode is positioned on the gate electrode side with respect to a point that divides a line segment that connects the center of the fourth nitride semiconductor layer and a boundary between the fourth nitride semiconductor layer and the third nitride semiconductor layer in a ratio of 2:3.

3. The compound semiconductor device according to claim 1, wherein the larger a distance is from a center of the second nitride semiconductor layer in planar view, the lower a dislocation density is in the second nitride semiconductor layer.

4. A manufacturing method of a compound semiconductor device, comprising:
   forming over a first nitride semiconductor layer of a first conductivity type an insulating film exposing a part of a surface of the first nitride semiconductor layer;
   forming a third nitride semiconductor layer of a second conductivity type covering at least a part of the insulating film over the first nitride semiconductor layer;
   forming a first opening exposing a part of the insulating film in the third nitride semiconductor layer;
   forming a fourth nitride semiconductor layer of the first conductivity type through a lateral crystal growth in the first opening;
   forming a second nitride semiconductor layer of the first conductivity type being in contact with an upper surface of the first nitride semiconductor layer and a side surface of the third nitride semiconductor layer; and
   forming a source electrode on the fourth nitride semiconductor layer, a drain electrode on a rear surface of the first nitride semiconductor layer, and a gate electrode over a portion positioned between the second nitride semiconductor layer and the fourth nitride semiconductor layer of the third nitride semiconductor layer across a gate insulating film.

5. The manufacturing method of a compound semiconductor device according to claim 4, wherein
   a second opening exposing a part of the first nitride semiconductor layer is formed in the third nitride semiconductor layer in parallel with the forming the first opening, and
   the second nitride semiconductor layer is formed in the second opening in parallel with the forming the fourth nitride semiconductor layer.

6. The manufacturing method of a compound semiconductor device according to claim 5, wherein the second nitride semiconductor layer is formed through a lateral crystal growth.

7. The manufacturing method of a compound semiconductor device according to claim 5, wherein the third nitride semiconductor layer is formed through a lateral crystal growth.

8. The manufacturing method of a compound semiconductor device according to claim 4, further comprising, after the forming the fourth nitride semiconductor layer:
   forming a second opening exposing a part of the first nitride semiconductor layer in the third nitride semiconductor layer; and
   forming a growth mask for the second nitride semiconductor layer on a bottom surface of the second opening,
   wherein, after the forming the growth mask, the second nitride semiconductor layer is formed in the second opening.

9. The manufacturing method of a compound semiconductor device according to claim 8, wherein the bottom surface of the second opening is positioned lower than a boundary between the first nitride semiconductor layer and the third nitride semiconductor layer.

10. The manufacturing method of a compound semiconductor device according to claim 8, wherein the second nitride semiconductor layer is formed through the lateral crystal growth.

11. The manufacturing method of a compound semiconductor device according to claim 8, wherein the third nitride semiconductor layer is formed through the lateral crystal growth.

12. The manufacturing method of a compound semiconductor device according to claim 4, wherein the forming the second nitride semiconductor layer comprises, before the forming the third nitride semiconductor layer:
   forming a fifth nitride semiconductor layer of the first conductivity type covering the insulating film over the first nitride semiconductor layer; and
   forming a third opening exposing a part of the insulating film in the fifth nitride semiconductor layer,
   a remainder of the fifth nitride semiconductor layer functions as the second nitride semiconductor layer, and
   the third nitride semiconductor layer is formed in the third opening.

13. The manufacturing method of a compound semiconductor device according to claim 12, wherein the second nitride semiconductor layer is formed through the lateral crystal growth.

14. The manufacturing method of a compound semiconductor device according to claim 12, wherein the third nitride semiconductor layer is formed through the lateral crystal growth.

15. The manufacturing method of a compound semiconductor device according to claim 4, wherein an end portion on the gate electrode side of the source electrode is positioned on the gate electrode side with respect to a point that divides a line segment that connects the center of the fourth nitride semiconductor layer in planar view and a boundary between the fourth nitride semiconductor layer and the third nitride semiconductor layer in a ratio of 2:3.

16. The manufacturing method of a compound semiconductor device according to claim 4, wherein the source electrode is positioned inside an outer edge of the insulating film in planar view.

\* \* \* \* \*